(12) United States Patent
Sun et al.

(10) Patent No.: US 12,019,913 B2
(45) Date of Patent: Jun. 25, 2024

(54) STORING LOG AND USER DATA IN SSD WITH INDEPENDENT PLANE OPERATIONS

(71) Applicant: Western Digital Technologies, Inc., San Jose, CA (US)

(72) Inventors: Chao Sun, San Jose, CA (US); Xinde Hu, San Jose, CA (US); Yongke Sun, San Jose, CA (US); Wen Pan, Santa Clara, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 32 days.

(21) Appl. No.: 17/321,736

(22) Filed: May 17, 2021

(65) Prior Publication Data

US 2022/0365719 A1    Nov. 17, 2022

(51) Int. Cl.
  *G06F 3/06* (2006.01)
(52) U.S. Cl.
  CPC .......... *G06F 3/0659* (2013.01); *G06F 3/0604* (2013.01); *G06F 3/0644* (2013.01); *G06F 3/0673* (2013.01)
(58) Field of Classification Search
  CPC .... G06F 3/0659; G06F 3/0604; G06F 3/0644; G06F 3/0673
  See application file for complete search history.

(56) References Cited

U.S. PATENT DOCUMENTS

| | | | |
|---|---|---|---|
| 10,133,625 B2 | 11/2018 | Bandic et al. | |
| 10,685,722 B1 | 6/2020 | Sharma et al. | |
| 11,003,586 B1* | 5/2021 | Lercari | G06F 3/0616 |
| 2016/0232168 A1* | 8/2016 | LeMoal | G06F 11/1435 |
| 2017/0147211 A1* | 5/2017 | Shiah | G06F 12/0893 |
| 2018/0046538 A1* | 2/2018 | Zhang | G06F 11/1048 |
| 2019/0370167 A1* | 12/2019 | Widder | G06F 3/061 |
| 2020/0004670 A1 | 1/2020 | Williams et al. | |
| 2020/0125294 A1* | 4/2020 | Parker | G06F 12/0804 |
| 2021/0011645 A1* | 1/2021 | Martinelli | G11C 11/2253 |

FOREIGN PATENT DOCUMENTS

CN        109976664 A       7/2019

OTHER PUBLICATIONS

Shibata, et al, ISSCC 2019 / Session 13 / Non-Volatile Memories / 13.1, A 1.33Tb 4-bit/Cell 3D-Flash Memory on a 96-Word-Line—Layer Technology, 2019 IEEE International Solid-State Circuits Conference, 3 pages.

* cited by examiner

*Primary Examiner* — Ramon A. Mercado
(74) *Attorney, Agent, or Firm* — PATTERSON + SHERIDAN, LLP

(57) ABSTRACT

A data storage device includes a memory device and a controller coupled to the memory device. The memory device is arranged in a plurality of logical planes and the controller is configured to write log data and user data to separate planes within the memory device, such that the log data and user data are isolated from each other on separate planes. The controller is configured to read log data from one plane and user data on another plane simultaneously, where the log data and the user data are isolated from each other on separate planes.

19 Claims, 8 Drawing Sheets

STORING LOG AND USER DATA IN SSD WITH INDEPENDENT PLANE OPERATIONS

BACKGROUND OF THE DISCLOSURE

Field of the Disclosure

Embodiments of the present disclosure generally relate to reading and programming log data and user data separately using independent plane read and independent plane write, respectively.

Description of the Related Art

When programming data to the memory device of the data storage device, data may be programmed to and read from parallel planes on different wordlines, concurrently, due to independent plane write and independent plane read. Independent plane write and independent plane read allows for the controller to program different wordlines of parallel planes concurrently and read from different wordlines of parallel planes concurrently.

Data storage devices, such as solid state drives (SSDs), have a plurality of different performance metrics, such as a time to read (TTR) and a time to performance (TTP). Typically, TTR refers to a time that the data storage device is ready to receive a host command and TTP refers to a time to reach a steady state performance. The duration between TTR and TTP may be high, but a certain bandwidth may be guaranteed between the two states. The loading of logical to physical (L2P) entries blocks the host access of the data stored in the memory device since L2P loading has a higher priority than host read or write commands.

Therefore, there is a need in the art to improve the storing and reading log data and user data in a data storage device.

SUMMARY OF THE DISCLOSURE

The present disclosure generally relates to reading and programming log data and user data separately using independent plane read and independent plane write, respectively. A data storage device includes a memory device and a controller coupled to the memory device. The memory device is arranged in a plurality of logical planes and the controller is configured to write log data and user data to separate planes within the memory device, such that the log data and user data are isolated from each other on separate planes. The controller is configured to read log data from one plane and user data on another plane simultaneously, where the log data and the user data are isolated from each other on separate planes.

In one embodiment, a data storage device includes a memory device, wherein the memory device is arranged in a plurality of logical planes, and a controller coupled to the memory device. The controller is configured to write log data and user data to separate planes within the memory device such that the log data and user data are isolated from one another on separate planes.

In another embodiment, a data storage device includes a memory device, wherein the memory device is arranged in a plurality of logical planes, wherein log data is isolated on a separate plane from user data, wherein a first plane of the plurality of logical planes includes log data, and wherein a second plane of the plurality of logical planes includes user data, and a controller coupled to the memory device. The controller is configured to read log data from a first plane of the plurality of logical planes and read user data from a second plane of the plurality of logical planes.

In another embodiment, a data storage device includes memory means and a controller coupled to the memory means. The controller is configured to write log data to the memory means, write user data to the memory means, wherein the controller is configured to write the user data to isolate the user data from the log data, read log data from the memory means, and read user data from the memory means, wherein the controller is configured to read the log data and the user data simultaneously.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to reading and programming log data and user data separately using independent plane read and independent plane write, respectively. A data storage device includes a memory device and a controller coupled to the memory device. The memory device is arranged in a plurality of logical planes and the controller is configured to write log data and user data to separate planes within the memory device, such that the log data and user data are isolated from each other on separate planes. The controller is configured to read log data from one plane and user data on another plane simultaneously, where the log data and the user data are isolated from each other on separate planes.

Figure 1:
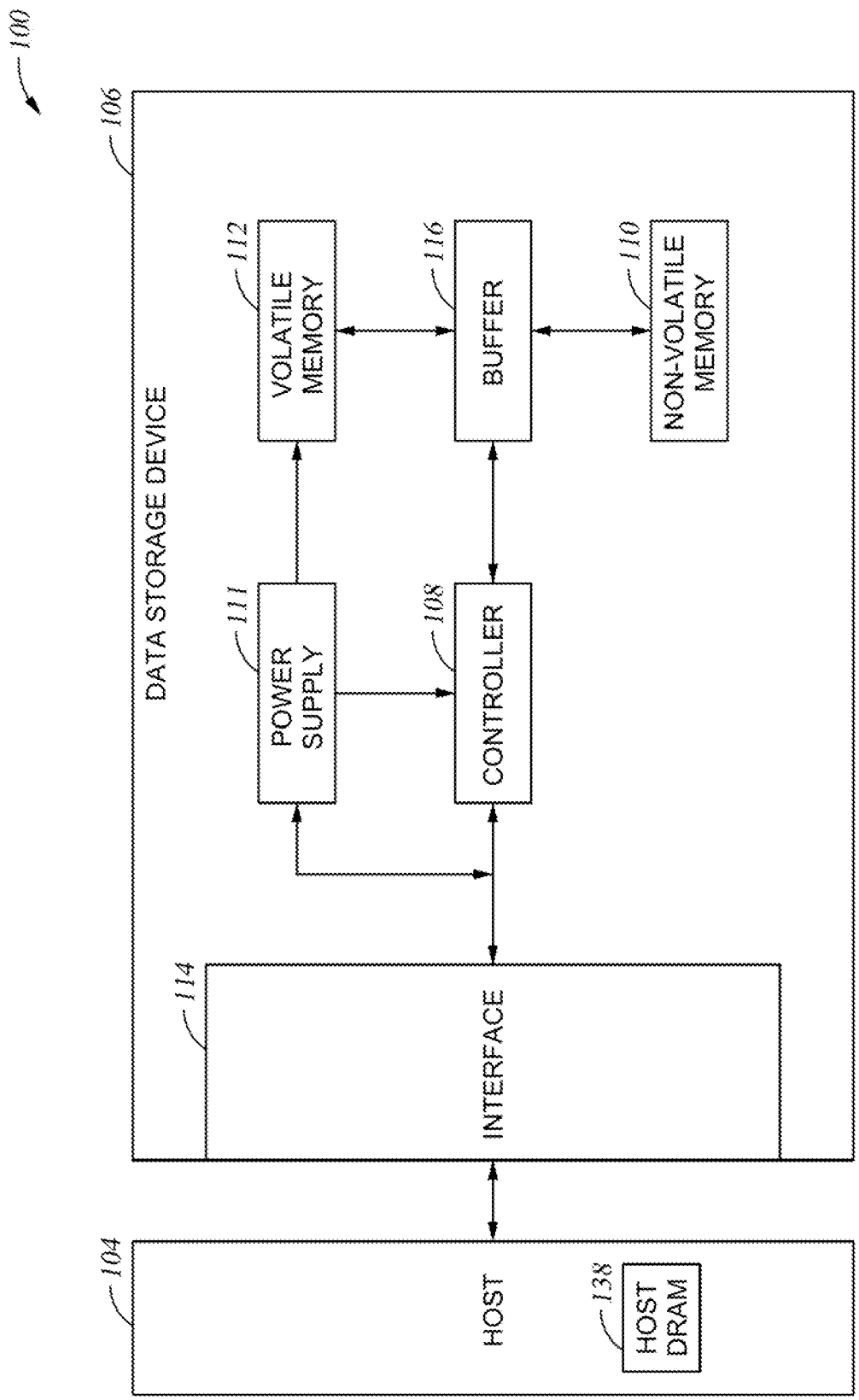
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

The interface 114 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit may receive a message from the controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an on-board backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, the controller 108 may use volatile memory 112 as a cache. For instance, the controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The controller 108 may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2A:
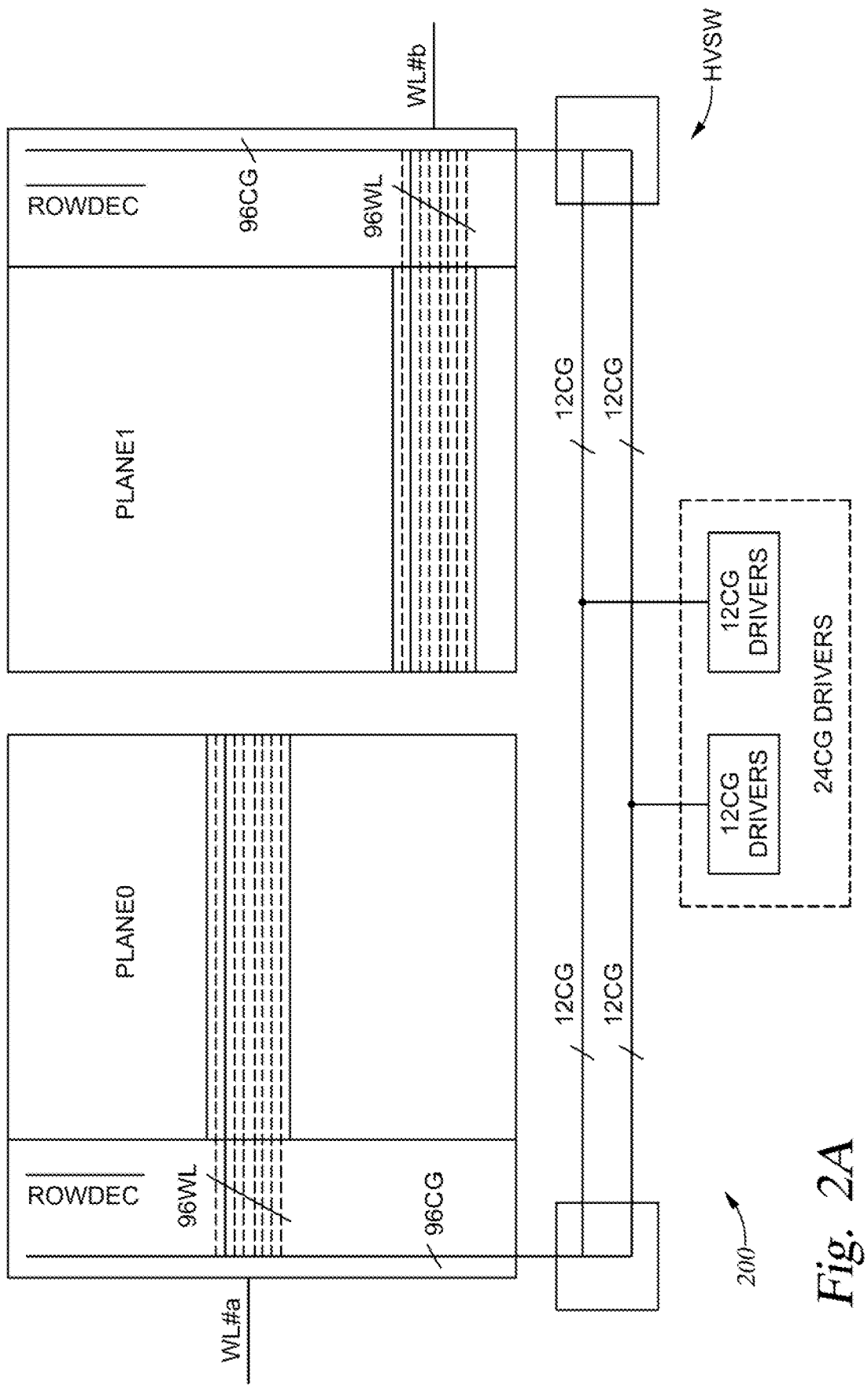
FIG. 2A is a schematic illustration of an independent plane write of a die, according to certain embodiments.

FIG. 2A is a schematic illustration of an independent plane write of a die 200, according to certain embodiments. The die 200 includes a plane0 and a plane1, where plane0 and plane1 are parallel planes. Each plane includes 96 wordlines (WLs). The die 200 is coupled to a plurality of control gate (CG) drivers, where each CG driver is able to service a WL. The term "service" may refer to programming data to or reading data from the target wordline. As illustrated in FIG. 2A, the die 200 is coupled to 24 CG drivers. The 24 CG drivers are grouped into groups of 12 CG drivers. However, each group of CG drivers is coupled to each plane via circuitry, such that one CG driver group may service plane0 and the other CG driver group may service plane1, or vice-versa. In some embodiments, each CG group may partially service plane0 and partially service plane1, such that more CG drivers are servicing one plane than the other plane. In other embodiments, each plane may be serviced by equal number of CG drivers. As illustrated in FIG. 2A, each plane of the die 200 may be serviced independently of each other, such that WL #a of plane0 and WL #b of plane1 are different wordlines of each plane. For example, WL #a may be WL12 and WL #b may be WL36. The previously listed values are not intended to be limiting, but to provide an example of a possible embodiment.

Figure 2B:
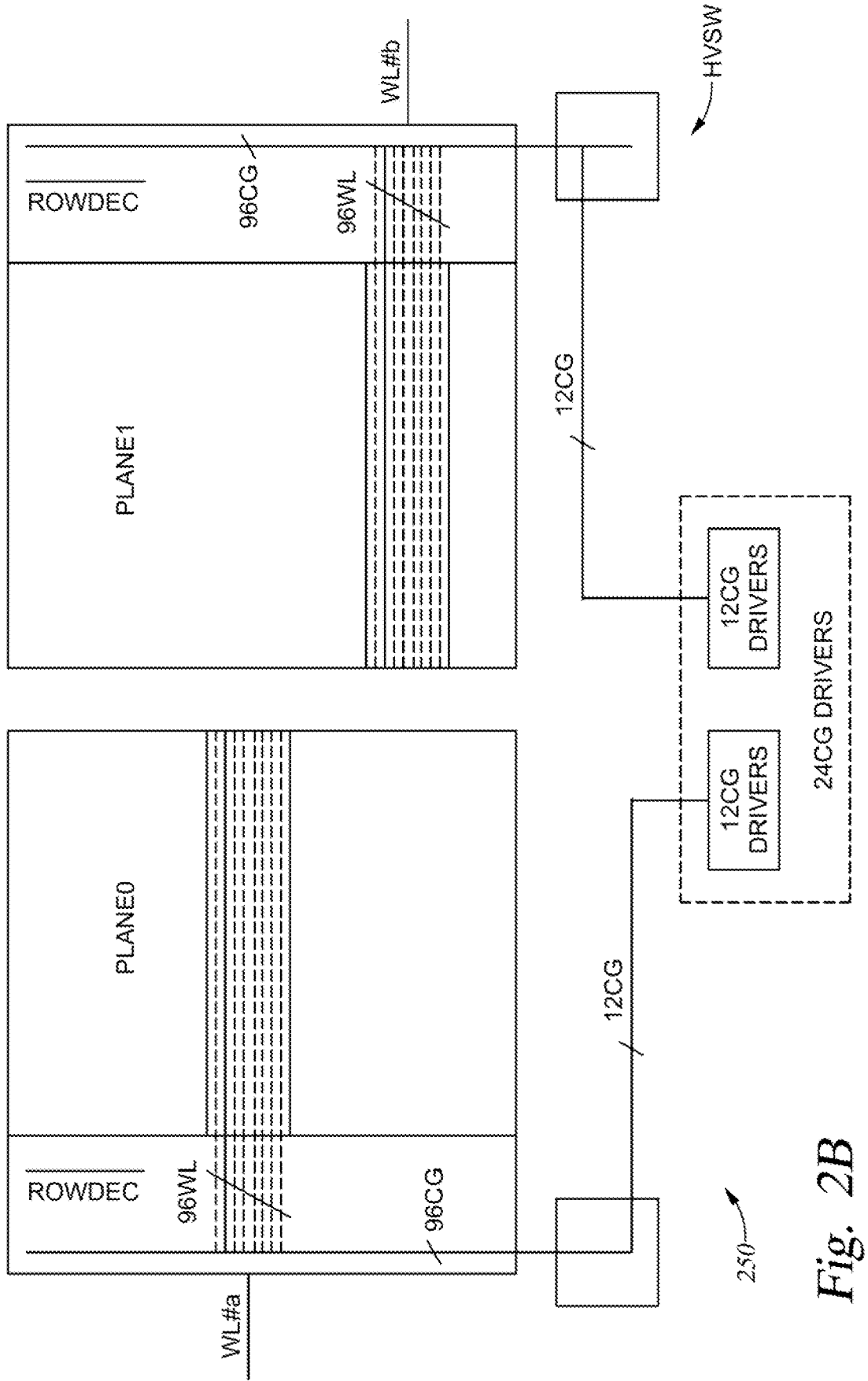
FIG. 2B is a schematic illustration of an independent plane read of a die, according to certain embodiments.

FIG. 2B is a schematic illustration of an independent plane read of a die 250, according to certain embodiments. It is to be understood that the die 250 may be another embodiment of the die 200. Rather than each CG driver group having circuitry coupling each CG group to both planes, as illustrated in FIG. 2A, each CG driver group has circuitry coupling the CG driver group to a plane. For example, a first CG driver group including 12 CG drivers is coupled to the first plane0 and a second CG driver group including 12 CG drivers is coupled to the second plane0. Because only 12 CG drivers are coupled to each plane, 12 WLs of each plane may be serviced concurrently. As illustrated in FIG. 2B, each plane of the die 250 may be serviced independently of each other, such that WL #a of plane0 and WL #b of plane1 are different wordlines of each plane. For example, WL #a may be WL12 and WL #b may be WL36. The previously listed values are not intended to be limiting, but to provide an example of a possible embodiment.

Figure 3:
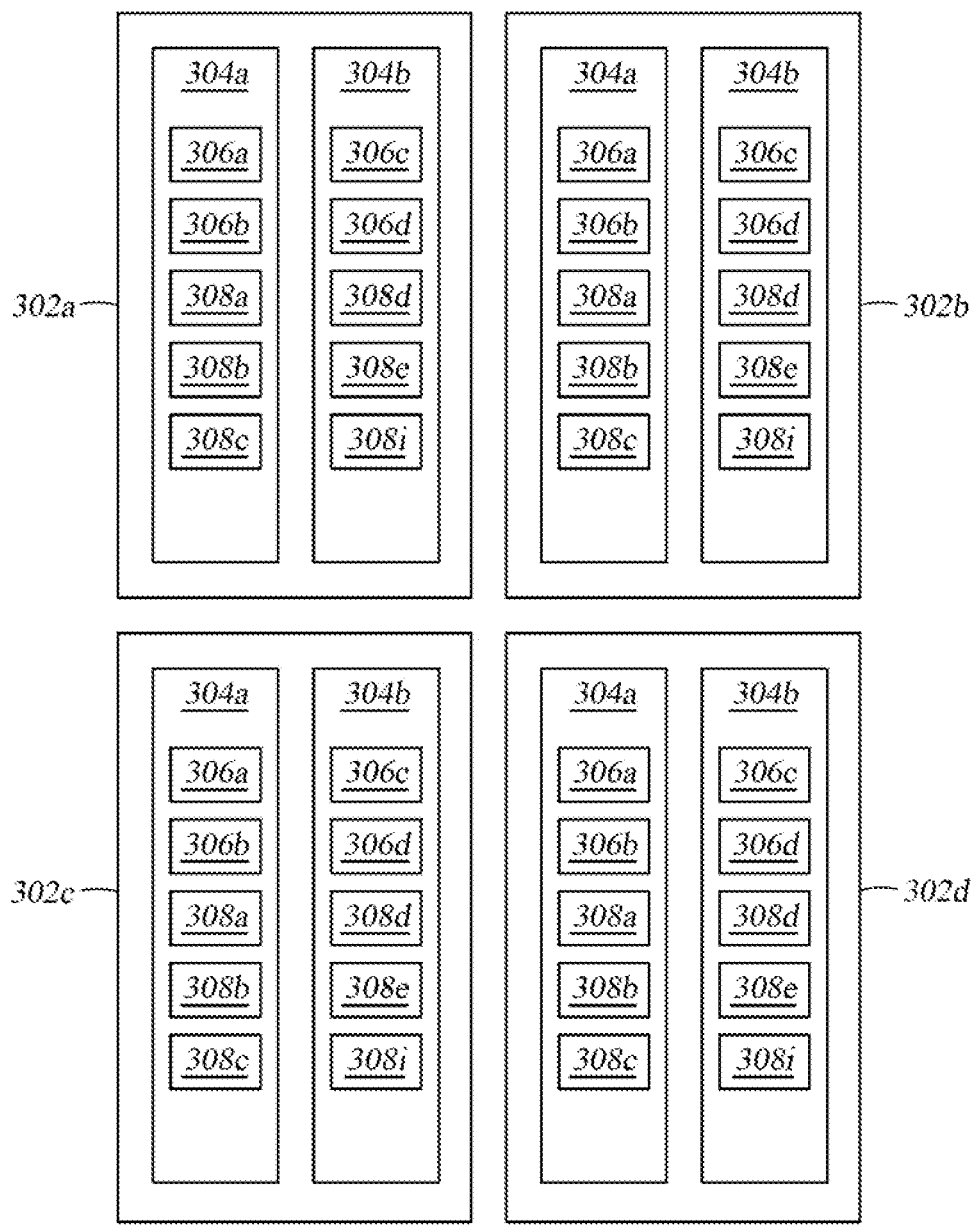
FIG. 3 is a schematic block diagram of a data mapping, according to certain embodiments.

FIG. 3 is a schematic block diagram of a data mapping 300, according to certain embodiments. The data mapping 300 may be implemented in a NVM, such as the NVM 110 of FIG. 1. The data mapping 300 includes a first die 302a, a second die 302b, a third die 302c, and a fourth die 302d. The plurality of dies 302a-302d may be TLC memory dies or QLC memory dies. For example, TLC memory dies includes blocks that have 3 bits per memory cell and QLC memory dies includes blocks that have 4 bits per memory cell. Each of the plurality of dies 302a-302d includes a first plane 304a and a second plane 304b.

The first plane 304a includes a first log block 306a, a second log block 306b, a first user data block 308a, a second user data block 308b, and a third user data block 308c. The second plane 304b includes a third log block 306c, a fourth log block 306d, a fourth user data block 308d, a fifth user data block 308e, and a sixth user data block 308f. It is to be understood that more or less dies than the illustrated number of dies, more or less planes than the illustrated number of planes, and more or less blocks than the illustrated number of blocks (e.g., log blocks and user data blocks) are applicable to the embodiments described herein.

Logical to physical (L2P) log data may be stored in the plurality of log blocks 306a-306d. The plurality of log blocks 306a-306d may be superblocks. It is to be understood that references to a "log block" may refer to a "log superblock." The log superblocks includes log pages and metadata pages. A log page may map a logical block address (LBA) to a physical block address (PBA), where the PBA corresponds with a physical location of the data in the plurality of user data blocks 308a-308f. A metadata page may store data regarding the log pages, such as recovery information. The plurality of log blocks 306a-306d may be pseudo SLC (pSLC) or pseudo MLC (pMLC) log blocks. pSLC and pMLC refers to having a different memory cell capacity than the rest of the memory device. For example, if the first die 302a is a TLC memory device, each cell includes 3 bits. However, a pSLC block has 1 bit per cell and a pMLC has 2 bits per cell.

Because program and read operations of log data takes priority to program and read operations of user data, storing both user data and log data on the same plane may cause the performance of reads and writes to decrease. For example, because parallel planes may be programmed to or read from simultaneously, a controller, such as the controller 108 of FIG. 1, may execute a first write command to write log data to the first log block 306a and a second write command to write user data to the first user data block 308a and the fourth user data block 308d. Because the log data takes priority over the user data, the log data is programmed to the first log block 306a before the user data is programmed to the first user data block 308a. However, the fourth user data block 308d may be programmed concurrently with the first log block 306a. Even in an independent plane read situation, while planes 304a and 304b may be read independently, yet simultaneously, the user data blocks 308a-308c are not read until the log blocks 306a-306b have first been read within a plane. For example, for planes 304a and 304b, user data 308a-308c is not accessed until log blocks 306a-306b have been read. Therefore, when there is a read request for each of the first log block 306a, the second log block 306b, the first user data block 308a, the second user data block 308b, and the third user data block 308c for the first plane 304a of the first die 302a, the read requests for the log blocks 306a and 306b are serviced prior to servicing the user data blocks 308a-308c. Hence, the user data 308a-308c is not read until all of the log blocks 306a-306b have been read which leads to unpredictable performance between TTR and TTP.

Figure 4:
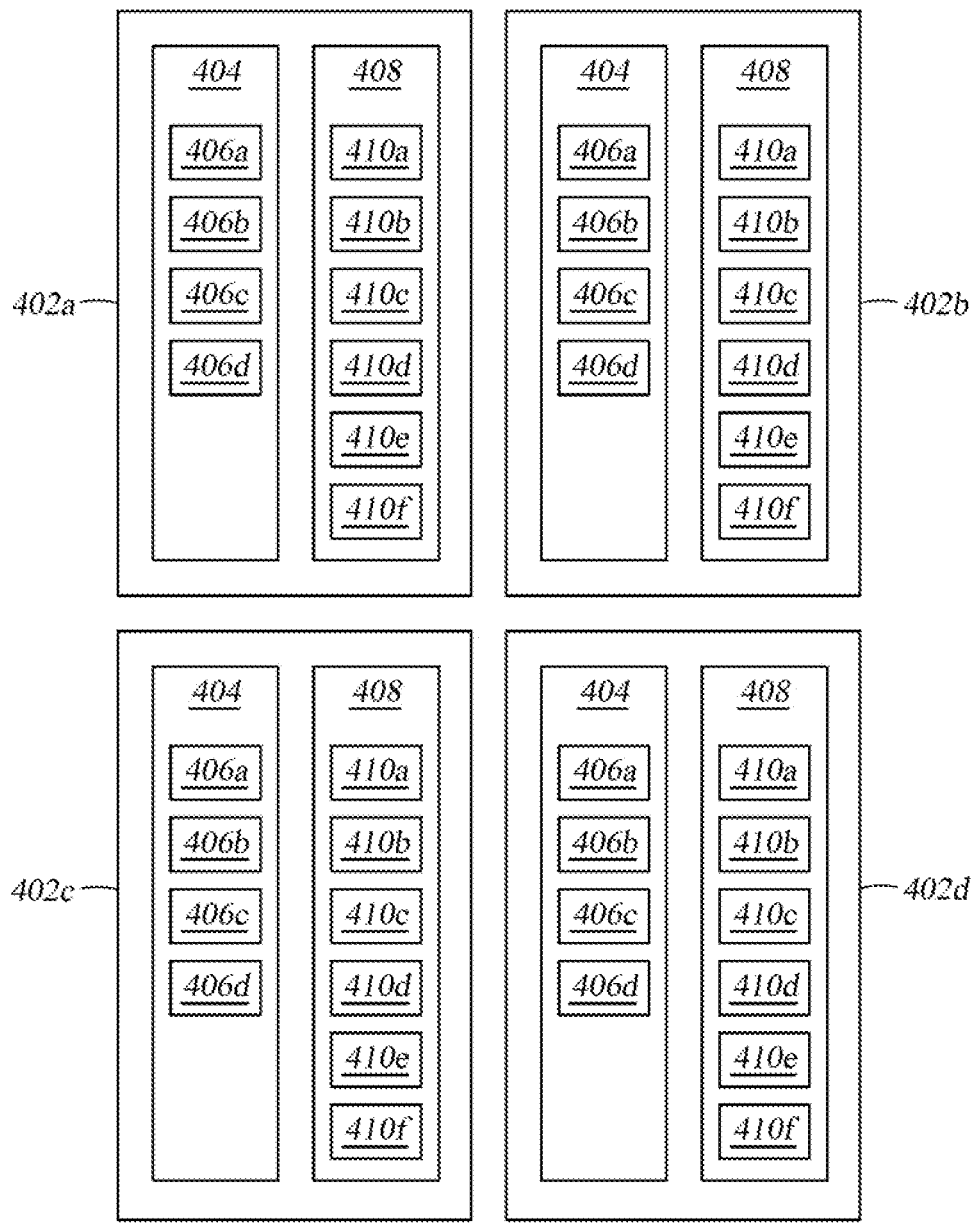
FIG. 4 is a schematic block diagram of a data mapping, according to certain embodiments.

FIG. 4 is a schematic block diagram of a data mapping 400, according to certain embodiments. The data mapping 400 may be implemented in a NVM, such as the NVM 110 of FIG. 1. The data mapping 400 includes a first die 402a, a second die 402b, a third die 402c, and a fourth die 402d. The plurality of dies 402a-402d may be TLC memory dies or QLC memory dies. For example, TLC memory dies includes blocks that have 3 bits per memory cell and QLC memory dies includes blocks that have 4 bits per memory cell.

Each of the plurality of dies 402a-402d includes a first plane 404 and a second plane 408. Rather than including both log blocks and user blocks on the same plane, the first plane 404 is provisioned to store log blocks 406a-406d and the second plane 408 is provisioned to store user data blocks 410a-410f. Although the plurality of dies 402a-402d are TLC or QLC memory dies, the log blocks of the first plane 404 may be pSLC or pMLC blocks. The first plane 404 includes a first log block 406a, a second log block 406b, a third log block 406c, and a fourth log block 406d. The second plane 408 includes a first user data block 410a, a second user data block 410b, a third user data block 410c, a fourth user data block 410d, a fifth user data block 410e, and a sixth user data block 410f. It is to be understood that more or less log blocks or data blocks may be present in a given plane.

When both log data and user data are scheduled to be programmed to or read from the first die 402a, both log data and user data may be programmed or read simultaneously due to independent plane write or independent plane read. Thus, there is no conflict between programming or reading both log data and user data when a plane is dedicated to log data and the other plane is dedicated to user data. In the current example, about 50% of the total bandwidth may be dedicated to programming or reading user data and the remaining about of the total bandwidth may be dedicated to programming or reading log data. In certain embodiments, at least one plane of each die is provisioned to store log data and includes either pSLC or pMLC blocks. In one embodiment, the log blocks are stored on a first plane of each die. In another embodiment, the log blocks are stored on an odd plane of each die. In the embodiment shown in FIG. 4, the data blocks 410a-410f can be read from or written to while the log blocks 406a-406d are read from or written to. Thus, the data blocks 410a-410f and processed (i.e., read or written) simultaneously, which may prolong the time period between TTR and TTP, but may guarantee predictable host I/O performance.

Figure 5:
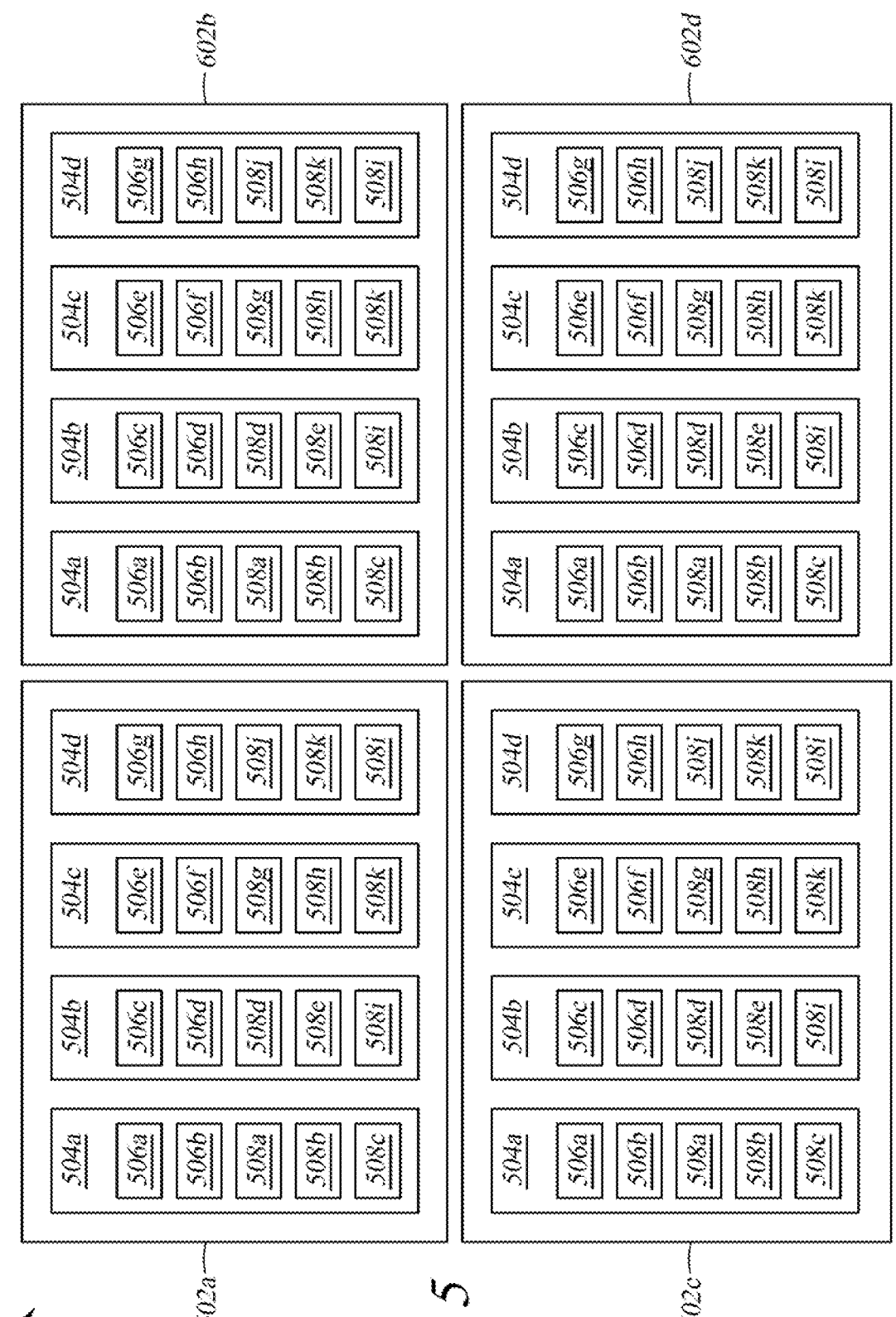
FIG. 5 is a schematic block diagram of a data mapping, according to certain embodiments.

FIG. 5 is a schematic block diagram of a data mapping 500, according to certain embodiments. The data mapping 500 may be implemented in a NVM, such as the NVM 110 of FIG. 1. The data mapping 500 includes a first die 502a, a second die 502b, a third die 502c, and a fourth die 502d. The plurality of dies 502a-502d may be TLC memory dies or QLC memory dies. For example, TLC memory dies includes blocks that have 3 bits per memory cell and QLC memory dies includes blocks that have 4 bits per memory cell. However, certain blocks, such as the log blocks, may be formatted as a pSLC or pSLC block.

Aspects of the data mapping 300 may be similar to the data mapping 500. For example, rather than each of the plurality of dies 502a-502d including two planes, each of the plurality of dies 502a-502d includes a first plane 504a, a second plane 504b, a third plane 504c, and a fourth plane 504d. The first plane 504a includes a first log block 506a, a second log block 506b, a first user data block 508a, a second user data block 508b, and a third user data block 508c. The second plane 504b includes a third log block 506c, a fourth log block 506d, a fourth user data block 508d, a fifth user data block 508e, and a sixth user data block 508f. The third plane 504c includes a fifth log block 506e, a sixth log block 506f, a seventh user data block 508g, an eighth user data block 508h, and a ninth user data block 508i. The fourth plane 504d includes a seventh log block 506g, an eighth log block 506h, a tenth user data block 508j, an eleventh user data block 508k, and a twelfth user data block 508l.

Because program and read operations of log data takes priority to program and read operations of user data, storing both user data and log data on the same plane may be cause the performance of reads and writes to decrease. For example, because parallel planes may be programmed to or read from simultaneously, a controller, such as the controller 108 of FIG. 1, may execute a first write command to write log data to the first log block 506a of the first plane 504a and another write command to each of the second plane 504b, the third plane 504c, and the fourth plane 504d in parallel. However, if a second write command to write user data to the first user data block 508a is received, the second write command is delayed until the first write command is completed. Because the log data takes priority over the user data, the log data is programmed to the first log block 506a before the user data is programmed to the first user data block 508a. Hence, the user data 508a-508l is not read from or written to until all of the log blocks 506a-506h have been read from or written to, when there are pending operations for log blocks 506a-506h, which leads to unpredictable performance between TTR and TTP.

Figure 6:
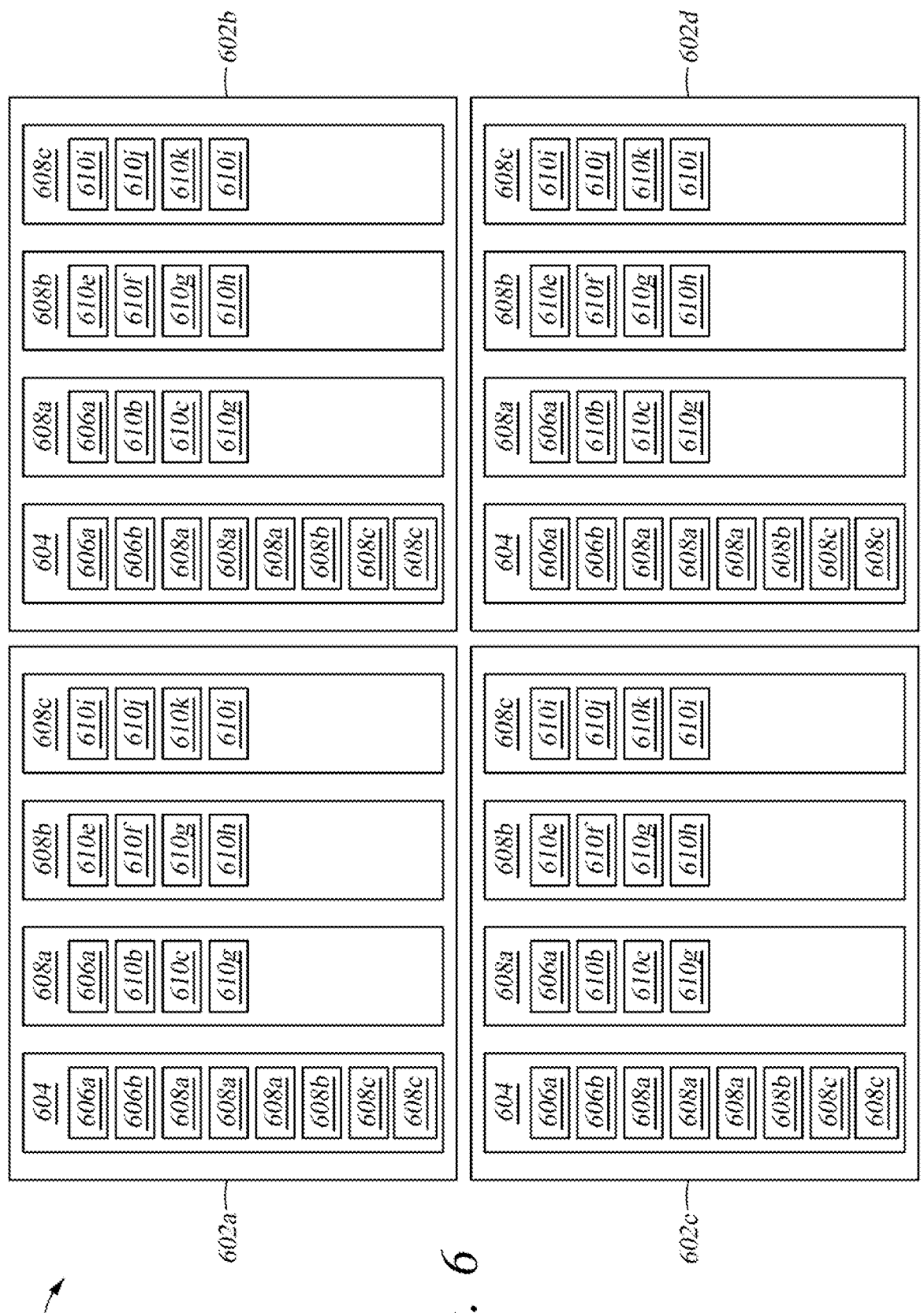
FIG. 6 is a schematic block diagram of a data mapping, according to certain embodiments.

FIG. 6 is a schematic block diagram of a data mapping 600, according to certain embodiments. The data mapping 600 may be implemented in a NVM, such as the NVM 110 of FIG. 1. The data mapping 600 includes a first die 602a, a second die 602b, a third die 602c, and a fourth die 602d. The plurality of dies 602a-602d may be TLC memory dies or QLC memory dies, where certain planes may be formatted or provisioned to include pSLC or pMLC blocks. For example, TLC memory dies includes blocks that have 3 bits per memory cell and QLC memory dies includes blocks that have 4 bits per memory cell. However, certain planes of the TLC memory dies or the QLC memory dies may be formatted as a pSLC or pMLC plane so that the blocks of the pSLC plane have 1 bit per memory cell and the blocks of the pMLC plane have 2 bits per memory cell.

Aspects of the data mapping 400 may be similar to the data mapping 600. For example, rather than each of the plurality of dies 602a-602d including two planes, each of the plurality of dies 602a-602d includes a first plane 604, a second plane 608a, a third plane 608b, and a fourth plane 608c. The first plane 604 of each die includes a plurality of log blocks 606a-606h. The second plane 608a includes a first user data block 610a, a second user data block 610b, a third user data block 610c, and a fourth user data block 610d. The third plane 608b includes a fifth user data block 610e, a sixth user data block 610f, a seventh user data block 610g, and an eighth user data block 610h. The fourth plane 608c includes a ninth user data block 610i, a tenth user data block 610j, an eleventh user data block 610k, and a twelfth user data block 610l.

In some embodiments, at least one plane of each die is provisioned to store log data, such that the blocks are log blocks and are pSLC or pMLC blocks. For example, the first plane 604 is provisioned as a pSLC or pMLC log plane. Thus, when programming both log data and user data, both log data and user data may be programmed to the same die of the plurality of dies 602a-602d simultaneously because the log data and the user data are stored independently or separately of each other on different planes of the same die. Likewise, the user data and the log data may be read simultaneously because the log data and the user data are stored independently or separately of each other on different planes of the same die. Independent plane write and independent plane read may allow for non-parallel wordlines of parallel planes to be programmed to or read from. When one plane out of four planes are provisioned to store log data, about 75% of the total bandwidth may be dedicated to storing user data to the user data blocks and about 25% of the total bandwidth may be dedicated to storing log data to the log blocks. In the embodiment shown in FIG. 6, the data blocks 610a-610l can be read from or written to while the log blocks 606a-606h are read from or written to. Thus, the data blocks 610a-610l and processed (i.e., read or written) simultaneously, which may prolong the time period between TTR and TTP but guaranteeing predictable host I/O performance.

It is to be understood that the storing of log data and user data may be stored on separate memory devices. For example, a first memory device, such as the NVM, may be used to store user data and a second memory device, such as MRAM, may be used to store log data.

Figure 7:
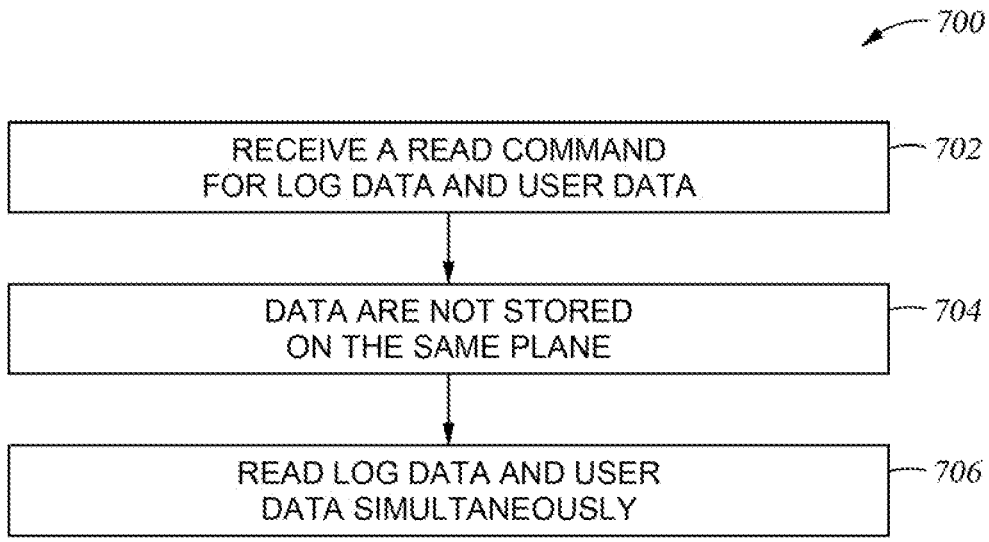
FIG. 7 is a schematic flowchart of a method of reading user data, according to certain embodiments.

FIG. 7 is a schematic flowchart of a method 700 of reading user data during TTR to TTP, according to certain embodiments. At block 702, a controller, such as the controller 108 of FIG. 1, receives a read command from a host device, such as the host device 104 of FIG. 1, to read user data stored on different memory devices or the same memory die. At block 704, the controller 108 determines that log data, such as L2P data, associated with the user data and the user data are not stored on the same plane since the log data is stored on a first plane dedicated to storing log data and the user data is stored on one or more second planes dedicated to storing user data. The log data is stored in pSLC or pMLC blocks of the first plane of the die and the user data is stored in TLC or QLC blocks of the one or more second planes of the die. At block 706, the log data and the user data are read simultaneously from the respective planes of the die. The wordlines of the log data read and wordlines of the user data read may not be on the same wordline (i.e., parallel wordlines). However, because of independent plane read, different wordlines of the different planes of the same die may be read simultaneously.

Figure 8:
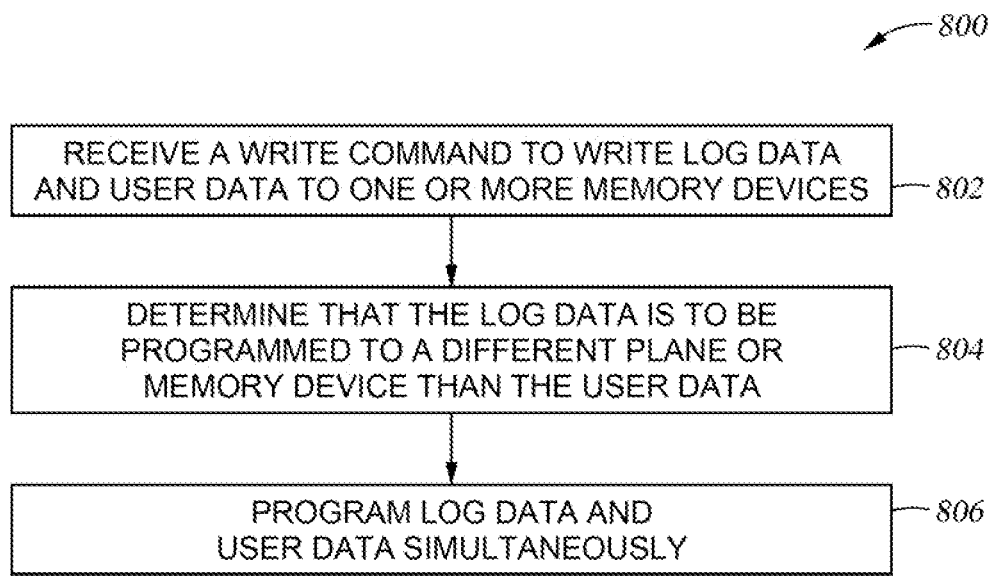
FIG. 8 is a schematic flowchart of a method of writing user data, according to certain embodiments.

FIG. 8 is a schematic flowchart of a method 800 of writing user data, according to certain embodiments. At block 802, a controller, such as the controller 108 of FIG. 1, receives a write command from a host device, such as the host device 104 of FIG. 1, to write user data to different memory devices or the same memory die. The controller 108 determines the location of the log in the data using an L2P table. If the log is not stored in the DRAM (or any other relevant location, such as SRAM), the log page is loaded into the DRAM. The log page may be loaded into the DRAM from the NVM, such as the NVM 110 of FIG. 1, or an internal cache or buffer of the data storage device. Furthermore, if data is updated in the NVM 110, the associated log page is updated and the log page is de-staged to the NVM 110 for persistence. Thus, when receiving a write command from the host device 104, the controller 108 may also generate a write command to write log data to the NVM 110.

At block 804, the controller 108 determines that the log data and user data are to be programmed to different planes of the same die since the log data is stored on a first plane dedicated to storing log data and the user data is stored on one or more second planes dedicated to storing user data. The log data is stored in pSLC or pMLC blocks of the first plane of the die and the user data is stored in TLC or QLC blocks of the one or more second planes of the die. Likewise, the log data may be stored on a first memory device dedicated to storing log data and the user data may be stored on a second memory device dedicated to storing user data. At block 806, the log data and the user data are programmed simultaneously to the respective planes of the same die or to the respective memory device. The wordlines of the log data programmed and wordlines of the user data programmed may not be on the same wordline (i.e., parallel wordlines). However, because of independent plane write, different wordlines of the different planes of the same die may be programmed simultaneously.

By isolating log data on a plane separate from planes storing user data of the same die, the performance of read and write operations for log data and user data may be more predictable and improved.

In one embodiment, a data storage device includes a memory device, wherein the memory device is arranged in a plurality of logical planes, and a controller coupled to the memory device. The controller is configured to write log data and user data to separate planes within the memory device such that the log data and user data are isolated from one another on separate planes.

The log data is disposed in a plane that is a pseudo single level cell (pSLC)/pseudo multi level cell (pMLC) plane. An entire plane in which the log data is disposed is pSLC/pMLC. The user data is disposed in a plane that is either a triple level cell (TLC) plane or a quad level cell (QLC) plane. The entire plane in which the user data is disposed is either TLC or QLC. The log data and the user data is written simultaneously. The log data and the user data is written on separate word lines. The plurality of logical planes includes two planes. The log data is written to a first plane of the two planes.

In another embodiment, a data storage device includes a memory device, wherein the memory device is arranged in a plurality of logical planes, wherein log data is isolated on a separate plane from user data, wherein a first plane of the plurality of logical planes includes log data, and wherein a second plane of the plurality of logical planes includes user data, and a controller coupled to the memory device. The controller is configured to read log data from a first plane of the plurality of logical planes and read user data from a second plane of the plurality of logical planes.

The plurality of logical planes includes four planes. The second plane is a triple level cell (TLC) plane and the first plane is different. The first plane is pseudo single level cell (pSLC)/pseudo multi level cell (pMLC). There is no log data disposed on any plane that includes user data. The memory device includes a plurality of dies. Each die includes at least a first plane and a second plane. Each first plane includes log data and no user data. Each second plane includes user data and no log data.

In another embodiment, a data storage device includes memory means and a controller coupled to the memory means. The controller is configured to write log data to the memory means, write user data to the memory means, wherein the controller is configured to write the user data to isolate the user data from the log data, read log data from the memory means, and read user data from the memory means, wherein the controller is configured to read the log data and the user data simultaneously.

The controller is configured to write the log data and the user data simultaneously. The user data and the log data are written to separate word lines. The log data and the user data are read from separate word line.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
 a memory device, wherein the memory device is arranged in a plurality of logical planes; and
 a controller coupled to the memory device, wherein the controller is configured to:
  write log data and user data to separate planes within the memory device, wherein the log data and the user data are isolated from one another on separate planes, wherein a first plane of the separate planes consists essentially of log data, wherein a second plane of the separate planes consists essentially of user data, wherein a total bandwidth is split equally between each of the separate planes based on a number of provisioned planes for log data and a number of provisioned planes for user data, wherein the total bandwidth is split between:
   programming or reading the user data; and
   programming or reading the log data, and wherein the log data comprises:
    log pages mapping a logical block address (LBA) of the user data to a physical block address (PBA) of the user data stored in the memory device; and
    metadata pages storing recovery information associated with the log pages;
  provision a first amount of planes to store the user data and a second amount of the planes to store the log data, wherein the first amount of planes is greater than the second amount of planes; and
  utilize a logical to physical (L2P) table to locate the log data stored in the memory device.

2. The data storage device of claim 1, wherein the log data is disposed in a plane that is a pseudo single level cell (pSLC)/pseudo multi level cell (pMLC) plane.

3. The data storage device of claim 2, wherein an entire plane in which the log data is disposed is pSLC/pMLC.

4. The data storage device of claim 1, wherein the user data is disposed in a plane that is either a triple level cell (TLC) plane or a quad level cell (QLC) plane.

5. The data storage device of claim 4, wherein an entire plane in which the user data is disposed is either TLC or QLC.

6. The data storage device of claim 1, wherein the log data and the user data is written simultaneously.

7. The data storage device of claim 6, wherein the log data and the user data is written on separate word lines.

8. The data storage device of claim 1, wherein the plurality of logical planes comprises two planes.

9. The data storage device of claim 8, wherein the log data is written to a first plane of the two planes.

10. A data storage device, comprising:
 a memory device, wherein:
  the memory device is arranged in a plurality of logical planes, wherein a total bandwidth is split equally between each of plurality of logical planes based on a number of provisioned planes for log data and a number of provisioned planes for user data, wherein the total bandwidth is split between:
   programming or reading the user data; and
   programming or reading the log data;
  log data is isolated on a separate plane from user data, wherein a first plane of the separate planes consists essentially of log data, wherein a second plane of the separate planes consists essentially of user data;
  a first plane of the plurality of logical planes comprises log data, wherein the log data comprises:
   log pages mapping a logical block address (LBA) of the user data to a physical block address (PBA) of the user data stored in the memory device; and
   metadata pages storing recovery information associated with the log pages;
  a second plane of the plurality of logical planes comprises user data; and
 a controller coupled to the memory device, wherein the controller is configured to:
  utilize a logical to physical (L2P) table to locate the log data stored in the memory device;
  read the log data from the first plane of the plurality of logical planes;
  read user data from the second plane of the plurality of logical planes; and
  provision a first amount of planes to store the user data and a second amount of the planes to store the log data, wherein the first amount of planes is greater than the second amount of planes.

11. The data storage device of claim 10, wherein the plurality of logical planes comprises four planes.

12. The data storage device of claim 10, wherein the second plane is a triple level cell (TLC) plane and the first plane is different.

13. The data storage device of claim 12, wherein the first plane is pseudo single level cell (pSLC)/pseudo multi level cell (pMLC).

14. The data storage device of claim 10, wherein the memory device comprises a plurality of dies, wherein each die comprises at least a first plane and a second plane, and wherein each first plane comprises log data and no user data.

15. The data storage device of claim 14, wherein each second plane comprises user data and no log data.

16. A data storage device, comprising:
 memory means; and
 a controller coupled to the memory means, wherein the controller is configured to:

write log data to a first location of the memory means, wherein the log data comprises:
  log pages mapping a logical block address (LBA) of user data to a physical block address (PBA) of the user data stored in the memory means; and
  metadata pages storing recovery information associated with the log pages;
write user data to a second location of the memory means, wherein the controller is configured to write the user data to isolate the user data from the log data on separate planes, wherein the first location is a first plane of the separate planes consisting essentially of log data, wherein the second location is a second plane of the separate planes consisting essentially of user data, wherein a total bandwidth is split equally between each location of the memory means based on a number of provisioned planes for log data and a number of provisioned planes for user data, wherein the total bandwidth is split between:
programming or reading the user data; and
programming or reading the log data;
utilize a logical to physical (L2P) table to locate the log data stored in the memory device;
read the log data from the first location of the memory means;
read the user data from the second location of the memory means, wherein the controller is configured to read the log data and the user data simultaneously; and
provision a first amount of first locations to store the user data and a second amount of the second locations to store the log data, wherein the first amount of first locations is greater than the second amount of second locations.

17. The data storage device of claim 16, wherein the controller is configured to write the log data and the user data simultaneously.

18. The data storage device of claim 17, wherein the user data and the log data are written to separate word lines.

19. The data storage device of claim 16, wherein the log data and the user data are read from separate word lines.

* * * * *